United States Patent
Choi et al.

(10) Patent No.: US 9,087,972 B2
(45) Date of Patent: Jul. 21, 2015

(54) FLAT PANEL DISPLAY DEVICE AND METHOD OF MANUFACTURING THE SAME

(71) Applicant: LG Display Co., Ltd., Seoul (KR)

(72) Inventors: Bong Ki Choi, Goyang-si (KR); Kwang Su Lim, Paju-si (KR); Hyo Dae Bae, Paju-si (KR); Chang Nam Kim, Paju-si (KR); Sang Kyu Lee, Daejeon (KR); Joon Won Park, Seoul (KR); Kyung Joon Yoon, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 8 days.

(21) Appl. No.: 13/860,369

(22) Filed: Apr. 10, 2013

(65) Prior Publication Data

US 2013/0270580 A1 Oct. 17, 2013

(30) Foreign Application Priority Data

Apr. 17, 2012 (KR) .......................... 10-2012-0040029

(51) Int. Cl.
*H01L 27/146* (2006.01)
*H01L 33/62* (2010.01)
*H01L 51/52* (2006.01)
*H01L 27/32* (2006.01)

(52) U.S. Cl.
CPC .............. *H01L 33/62* (2013.01); *H01L 27/323* (2013.01); *H01L 27/3276* (2013.01); *H01L 51/524* (2013.01); *H01L 2924/0002* (2013.01)

(58) Field of Classification Search
CPC ... H01L 27/12; H01L 27/323; H01L 27/3276; H01L 2924/0002
USPC ............................................ 257/E29.151, 258
See application file for complete search history.

(56) References Cited

U.S. PATENT DOCUMENTS

2006/0081845 A1* 4/2006 Bae .................. 257/59
2012/0319966 A1* 12/2012 Reynolds ....................... 345/173

* cited by examiner

*Primary Examiner* — Ajay K Arora
(74) *Attorney, Agent, or Firm* — Fenwick & West LLP

(57) ABSTRACT

A flat panel display device and method of manufacturing the display device. The display device comprises a first substrate and a connection pad located along a side of the first substrate. A second substrate overlaps with the first substrate, wherein the second substrate does not overlap with an exposed portion of the first substrate. A first contact pad electrically couples the second substrate and the first substrate. A first distance from the side of the first substrate to a boundary between the exposed portion of the first substrate and the second substrate is greater than a second distance from the side of the first substrate to the first contact pad. The display device may be, for example, a touch capable display device that uses the first contact pad to transfer touch sensing signals from the second substrate to the first substrate.

12 Claims, 15 Drawing Sheets

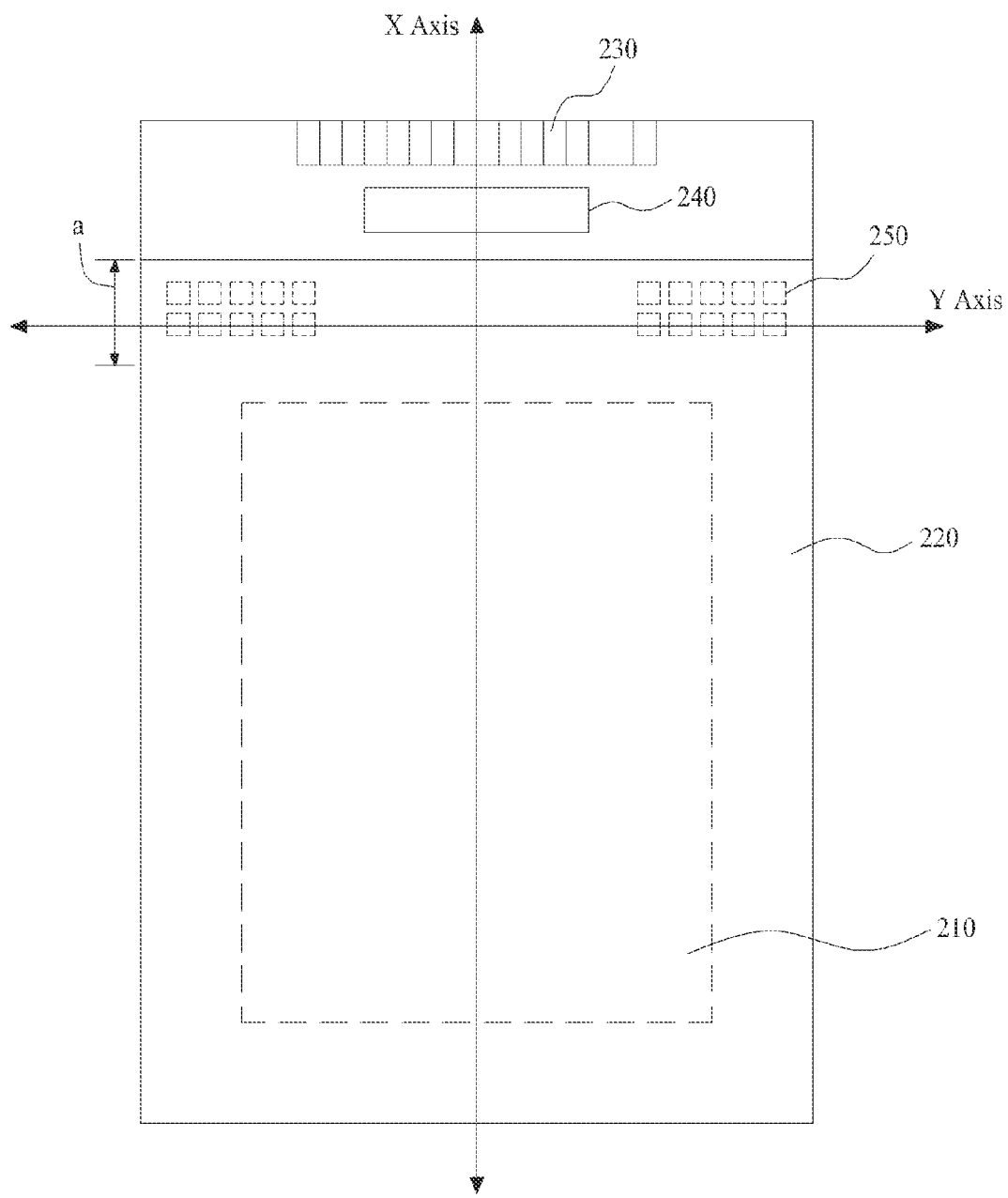

FLAT PANEL DISPLAY DEVICE AND METHOD OF MANUFACTURING THE SAME

CROSS-REFERENCE TO RELATED APPLICATIONS

This application claims the benefit of the Korean Patent Application No. 10-2012-0040029 filed on Apr. 17, 2012, which is hereby incorporated by reference in its entirety.

BACKGROUND

1. Field of the Invention

The present invention relates to a flat panel display device, and more particularly, to a flat panel display device including a touch screen panel and a method of manufacturing the same.

2. Discussion of the Related Art

Recently, with the advancement of various portable electronic devices such as mobile communication terminals and notebook computers, the demand for flat panel display devices applied to the portable electronic devices is increasing. Liquid crystal display (LCD) devices, plasma display panels (PDPs), field emission display (FED) devices, and organic light emitting diode (OLED) display devices have been developed as flat panel display devices.

Instead of input devices such as mouses and keyboards, touch screens that enable a user to directly input information with a finger or a pen and enable the easy manipulation of all users are applied as input devices for flat panel display devices. A touch screen is widely applied to monitors such as navigations, industrial terminals, notebook computers, financial automation equipment, and game machines, portable terminals such as portable phones, MP3 players, PDAs, PMPs, PSPs, portable game machines, DMB receivers, and tablet personal computers (PCs), and home appliances such as refrigerators, microwave ovens, and washing machines. Especially, since all users can easily manipulate the touch screen, the application of the touch screen is being expanded.

In general flat panel display devices, a touch screen is implemented using a touch screen panel adhered to an upper substrate. The flat panel display devices with the touch screen panel adhered thereto detect touched position information when a user's finger or a touch pen touches a screen.

However, since the touch screen panel is separately manufactured and adhered to the outer surface of the flap panel display device, the entire thickness of the flat panel display device increases, and moreover, the visibility of an image can be degraded due to a space between panels.

To overcome the above-described limitations, in-cell type flat panel display devices with a built-in touch screen panel are recently developed.

FIG. 1 is a sectional view schematically illustrating a related art in-cell type flat panel display device.

As illustrated in FIG. 1, the related art in-cell type flat panel display device includes a first substrate 110 and a touch screen panel 140 that are coupled to face each other with a thin film transistor (TFT) layer 120 and emission layer 130 therebetween.

The TFT layer 120 formed on the first substrate 110 is switched on to supply a voltage or a current (applied to a corresponding data line) to the emission layer 130 according to a gate signal applied to a corresponding gate line.

The emission layer 130 formed on the TFT layer 120 emits light with a voltage or a current applied through the TFT layer 120. The flat panel display device includes an active area and an inactive area that are divided by the emission layer 130.

The touch screen panel 140 is disposed on the emission layer 130, and includes a plurality of touch sensors (not shown). The touch screen panel 140 transfers signals sensed by the respective touch sensors to an integrated circuit IC (not shown), thereby allowing the IC to determine whether there is a touch and touched position information.

To this end, in in-cell type flat panel display devices, a contact pad for connecting the touch screen panel 140 and the TFT layer 120 should be additionally disposed in the inactive area. For this reason, in the related art in-cell type flat panel display device, a bezel area is enlarged in proportion to an area occupied by the contact pad.

SUMMARY

Accordingly, the present invention is directed to provide a flat panel display device and a method of manufacturing the same that substantially obviate one or more problems due to limitations and disadvantages of the related art.

An aspect of the present invention is directed to provide a flat panel display device and a method of manufacturing the same, which minimize a bezel area.

Another aspect of the present invention is directed to provide a flat panel display device and a method of manufacturing the same, which can ensure a contact between a TFT and a touch screen panel.

In addition to the aforesaid objects of the present invention, other features and advantages of the present invention will be described below, but will be clearly understood by those skilled in the art from descriptions below.

In addition to the aforesaid features and effects of the present invention, other features and effects of the present invention can be newly construed from the embodiments of the present invention.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

In one embodiment, disclosed is a flat panel display device. The display device comprises a first substrate and a connection pad located along a side of the first substrate. A second substrate overlaps with the first substrate, wherein the second substrate does not overlap with an exposed portion of the first substrate. A first contact pad electrically couples the second substrate and the first substrate. A first distance from the side of the first substrate to a boundary between the exposed portion of the first substrate and the second substrate is greater than a second distance from the side of the first substrate to the first contact pad.

In one embodiment, a second contact pad couples the second substrate and the first substrate. The first distance from the side of the first substrate to the boundary between the exposed portion of the first substrate and the second substrate is greater than a third distance from the side of the first substrate to the second contact pad. At least a part of the exposed portion of the first substrate can be between the first contact pad and the second contact pad and aligned along a straight line with the first contact pad and the second contact pad.

In one embodiment, an integrated circuit may be located on the exposed portion of the first substrate, wherein the integrated circuit is also located between the first contact pad and the second contact pad and aligned along a straight line with the first contact pad and the second contact pad. Additionally, the first substrate and the second substrate may include an active area and an inactive area outside of the active area. The first contact pad is located at a first side of the inactive area, and the second contact pad is located at a second side of the inactive area that is opposite to the first side.

In one embodiment, an adhesive layer is formed between the first substrate and the second substrate such that the adhesive layer surrounds the first contact pad.

In one embodiment, the display device is a touch capable display device. Thus, the second substrate includes a touch sensor and the first contact pad is adapted to transfer a touch sensing signal between the touch sensor and the first substrate. The first contact pad may also be electrically coupled to the connection pad, such as through signal wires of the first substrate.

In one embodiment, a light emission layer is between the first substrate and the second substrate and the first substrate includes thin film transistors that are electrically coupled to the light emission layer and are adapted to control light emitted by the light emission layer.

In one embodiment, the exposed portion of the first substrate is located at both a first side of the contact pad and a second side of the contact pad that is opposite from the first side of the contact pad.

In one embodiment, the boundary between the exposed portion of the first substrate and the second substrate is comprised of a plurality of straight lines.

In one embodiment, disclosed is a method of manufacturing a flat panel display device. A first substrate is prepared with a connection pad located along a side of the first substrate. A second substrate is prepared. The first substrate is attached to the second substrate such that the second substrate overlaps with the first substrate and the first substrate and the second substrate are electrically coupled via a contact pad. After attaching the first substrate to the second substrate, a portion of the second substrate is removed to expose a portion of the first substrate. A first distance from the side of the first substrate to a boundary between the exposed portion of the first substrate and the second substrate is greater than a second distance from the side of the first substrate to the contact pad.

In another embodiment of the method, a first substrate is prepared with a connection pad located along a side of the first substrate. A second substrate is prepared and a portion of the second substrate is removed. The shape and size of the removed portion of the second substrate corresponds to a portion of the first substrate that is to be exposed. After the portion of the second substrate is removed, the first substrate is attached to the second substrate such that the second substrate overlaps with the first substrate but does not overlap with an exposed portion of the first substrate, the first substrate and the second substrate being electrically coupled via a contact pad. In the resulting display device, a first distance from the side of the first substrate to a boundary between the exposed portion of the first substrate and the second substrate is greater than a second distance from the side of the first substrate to the contact pad.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIG. 2A is a plan view schematically illustrating the related art in-cell type flat panel display device;

DETAILED DESCRIPTION OF THE INVENTION

Hereinafter, embodiments of the present invention will be described in detail with reference to the accompanying drawings.

In description of embodiments of the present invention, when a structure is described as being formed at an upper portion/lower portion of another structure or on/under the other structure, this description should be construed as including a case where the structures contact each other and moreover a case where a third structure is disposed therebetween. However, when the term "directly on" or "directly under" is used, it should be restrictively construed that structures contact each other.

Figure 1:
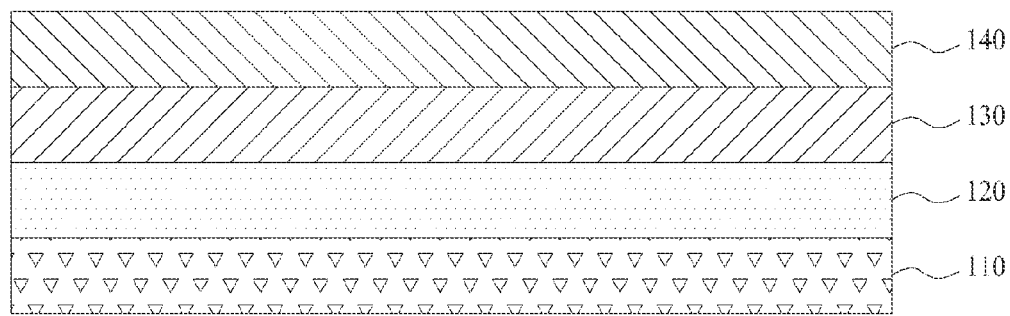
FIG. 1 is a sectional view schematically illustrating a related art in-cell type flat panel display device.

Hereinafter, for convenience of description, a first substrate 110 and a thin film transistor (TFT) 120 which are formed in FIG. 1 is referred as a lower substrate, and a touch screen panel 140 illustrated in FIG. 1 is referred to as an upper substrate.

Figure 2B:
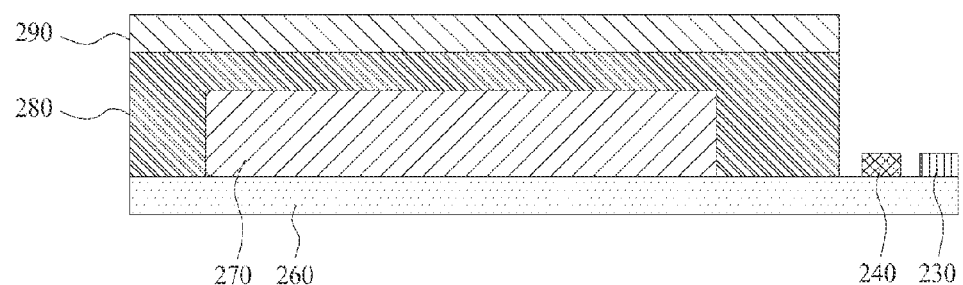
FIG. 2B is an X-axis sectional view of the in-cell type flat panel display device of FIG. 2A.
Figure 2C:
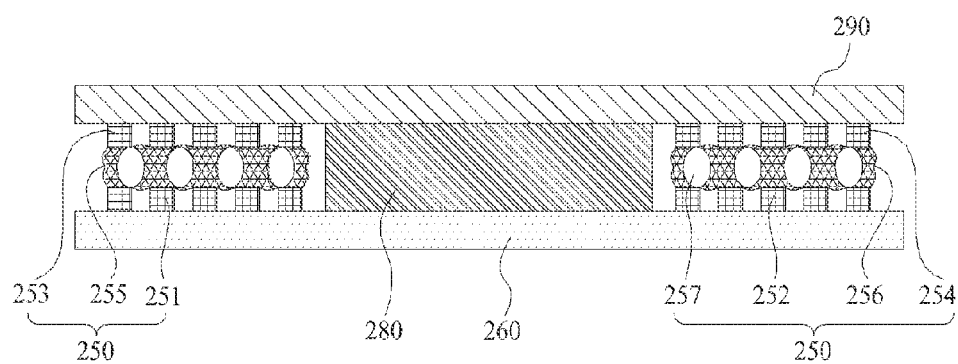
FIG. 2C is a Y-axis sectional view of the in-cell type flat panel display device of FIG. 2A.

FIG. 2A is a plan view schematically illustrating a related art in-cell type flat panel display device. FIG. 2B is an X-axis sectional view of the in-cell type flat panel display device of FIG. 2A. FIG. 2C is a Y-axis sectional view of the in-cell type flat panel display device of FIG. 2A. The following description may refer to elements shown in FIG. 2A, 2B, or 2C.

The related art in-cell type flat panel display device of FIG. 2A includes, as shown in FIG. 2B, a lower substrate 260 and an upper substrate 290 which are, as shown in FIG. 2A, divided into an active area 210 and an inactive area 220 formed outside the active area 210.

Here, the active area 210 is an area in which an emission layer 270 formed between the lower substrate 260 and the upper substrate 290 emits light. On the other hand, the inactive area 220 is an area which cannot emit light because the emission layer 270 is not formed therein.

The related art in-cell type flat panel display device includes a flexible printed circuit board (FPCB) connection pad 230 for enabling an FPCB (not shown) to connect the lower substrate 260 and the upper substrate 290, a driving IC 240, first and second lower contact pads 251 and 252, and first and second upper contact pads 253 and 254.

The first lower contact pad 251 is disposed in the lower substrate 260, and disposed at a first side of the inactive area 220. The first lower contact pad 251 may be provided as one, and, as illustrated in FIG. 2A, may be provided in plurality. Each of the first lower contact pads 251 is connected to a corresponding signal line (not shown) connected to the FPCB connection pad 230.

The second lower contact pad 252 is disposed in the inactive area 220 in the lower substrate 260, and disposed at a second side facing the first side at which the first lower contact pad 251 is disposed. The second lower contact pad 252 may be provided as one, and, as illustrated in FIG. 2A, may be provided in plurality. Each of the second lower contact pads 252 is connected to a corresponding signal line (not shown) connected to the FPCB connection pad 230.

The FPCB connection pad 230 and the driving IC 240 may be disposed in the lower substrate 260, and disposed between the first and second lower contact pads 251 and 252. The driving IC 240 supplies a driving signal to the lower substrate 260. Also, the driving IC 240 may receive touch sensing signals from the upper substrate 290 to determine whether there is a touch and a touched position.

In the above-described embodiment, the driving IC 240 has been described above as processing the touch sensing signals. In another embodiment, the FPCB (not shown) connected to the FPCB connection pad 230 or another circuit part (not shown) may process the touch sensing signals.

The first upper contact pad 253 is disposed under the upper substrate 290, and disposed to face the first lower contact pad 251. The second upper contact pad 253 is disposed under the upper substrate 290, and disposed to face the second lower contact pad 252.

FIG. 2B is an X-axis sectional view of the in-cell type flat panel display device of FIG. 2A.

Referring to FIG. 2B, the upper substrate 290 of the related art in-cell type flat panel display device includes an upper cutting area for externally exposing the FPCB connection pad 230 and the driving IC 240. This is because the upper substrate 290 needs to be opened for electrically connecting the FPCB connection pad 230 and the driving IC 240 to the outside.

The upper cutting area is formed by irradiating a laser beam along a laser cutting line which is extended as one straight line from the first side to the second side of the upper substrate 290. In this case, the laser cutting line is not formed in the first and second contact pads 253 and 254 but is formed between an area with the first and second upper contact pads 253 and 254 disposed therein and an area with the driving IC 240 disposed therein.

In the related art in-cell type flat panel display device in which the upper cutting area is formed as described above, as illustrated in FIG. 2A, a bezel area is enlarged in proportion to an area "a" in which the contact pad 250 is disposed.

As described above, since the bezel area is enlarged, the screen of the related art in-cell type flat panel display device is viewed smaller than general flat panel display devices having the same screen size.

FIG. 2C is a Y-axis sectional view of the in-cell type flat panel display device of FIG. 2A.

Referring to 2C, the related art in-cell type flat panel display device includes the lower substrate 260, the first and second lower contact pads 251 and 252, the first and second upper contact pads 253 and 254, first and second sealing materials 255 and 256, an adhesive layer 280, and the upper substrate 290.

The first sealing material 255 is disposed between the first lower contact pad 251 and the first upper contact pad 253. The first sealing material 255 includes a plurality of gold (AU) balls 257, and electrically connects the first lower contact pad 251 and the first upper contact pad 253 which contact the AU balls 257.

The second sealing material 256 is disposed between the second lower contact pad 252 and the second upper contact pad 254. The second sealing material 256 includes a plurality of AU balls 257, and electrically connects the second lower contact pad 252 and the second upper contact pad 254 which contact the AU balls 257.

The adhesive layer 280 is formed between the lower substrate 260 and the upper substrate 290, for coupling the lower substrate 260 to the second substrate 290. As illustrated in FIG. 2C, the adhesive layer 280 is formed between the first and second sealing materials 255 and 256, but is not formed outside the first and second sealing materials 255 and 256.

As described above, since the first and second sealing materials 255 and 256 are exposed to the outside, the related art in-cell type flat panel display device cannot ensure a contact between the lower contact pad and the upper contact pad. This is because the first and second sealing materials 255 and 256 are affected by an external impact or penetrating moisture. In the first and second sealing materials 255 and 256, a contact resistance of each of the AU balls 257 is increased by moisture. Also, the first and second sealing materials 255 and 256 can deviate from the respective contact pads due to an impact or moisture, causing a defective contact in which the lower contact pad cannot contact the upper contact pad.

Hereinafter, an in-cell type flat panel display device according to an embodiment of the present invention for overcoming the above-described limitations of the related art in-cell type flat panel display device will be described in detail with reference to FIGS. 3A to 5B.

Figure 3A:
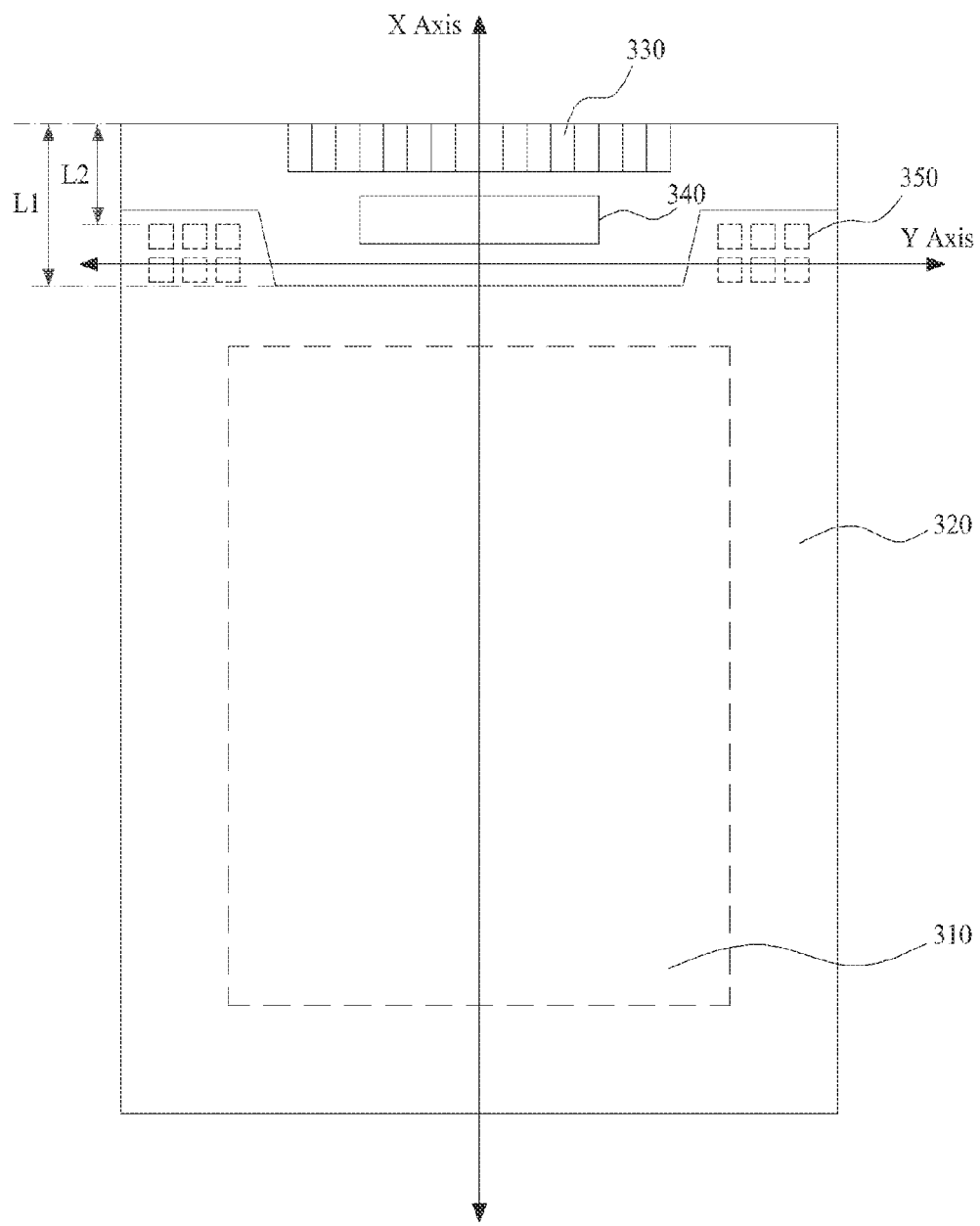
FIG. 3A is a plan view schematically illustrating an in-cell type flat panel display device according to an embodiment of the present invention.
Figure 3B:
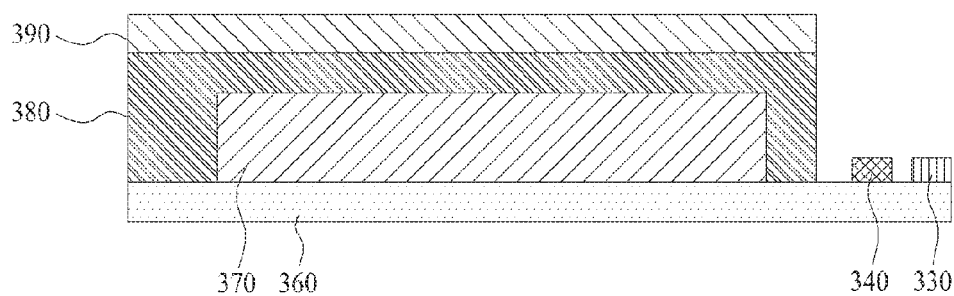
FIG. 3B is an X-axis sectional view of the in-cell type flat panel display device of FIG. 3A.
Figure 3C:
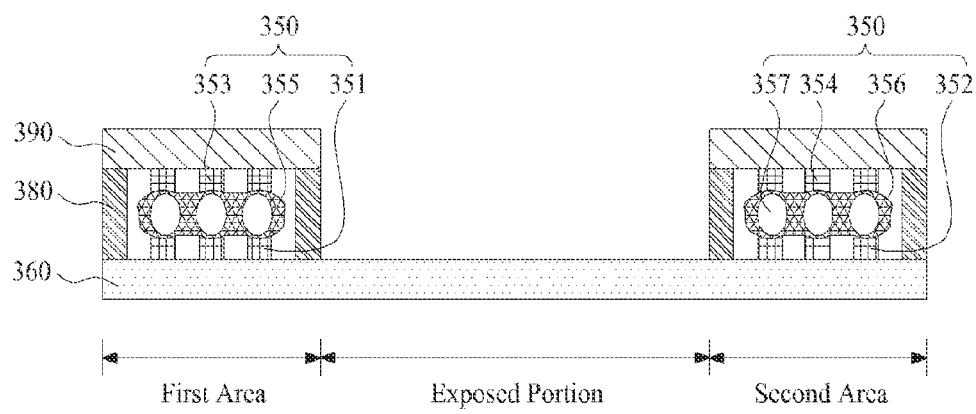
FIG. 3C is a Y-axis sectional view of the in-cell type flat panel display device of FIG. 3A.

FIG. 3A is a plan view schematically illustrating an in-cell type flat panel display device according to an embodiment of the present invention. FIG. 3B is an X-axis sectional view of the in-cell type flat panel display device of FIG. 3A. FIG. 3C is a Y-axis sectional view of the in-cell type flat panel display device of FIG. 3A. The following description may refer to elements shown in FIG. 3A, 3B, or 3C.

The in-cell type flat panel display device of FIG. 3A includes, as shown in FIG. 3B, a lower substrate 360 and an upper substrate 390 that overlaps with most of the lower substrate 360. The lower substrate 360 and upper substrate 390 are divided into, as shown in FIG. 3A, an active area 310 and an inactive area 320 formed outside the active area 310. The active area 310 and inactive area 320 of each of the lower substrate 360 and upper substrate 390 correspond to each other.

Here, the active area 310 is an area in which an emission layer 370 formed between the lower substrate 360 and the upper substrate 390 emits light. On the other hand, the inactive area 320 is an area which cannot emit light because the emission layer 370 is not formed therein.

The in-cell type flat panel display device according to an embodiment of the present invention includes an FPCB connection pad 330, a driving IC 340, and a contact pad 350 which are disposed between the lower substrate 360 and the upper substrate 390.

The contact pad 350 electrically couples the lower substrate 360 and the upper substrate 390. A plurality of the contact pads 350 are respectively disposed at a first side and a second side (facing the first side) of the inactive area 320. Each contact pad 350 transfers touch sensing signals from touch sensors of the upper substrate 390 to the lower substrate 360.

The FPCB connection pad 330 is disposed in the inactive area 320 in the lower substrate 360 and located along the top side of the lower substrate 360. The FPCB connection pad 330 is also disposed between the contact pad 350 disposed at the first side of the display device and the contact pad 350 disposed at the second side of the display device. The FPCB connection pad 330 is connected to an FPCB (not shown) formed of a conductive film. The FPCB connection pad 330 is also connected to the driving IC 340, and transfers various driving signals, supplied from the outside and source power, to the lower substrate 360 or the upper substrate 390.

The driving IC 340 is disposed in the inactive area 320 in the lower substrate 360. The driving IC 340 is also disposed between the contact pad 350 disposed at the first side of the display device and the contact pad 350 disposed at the second side of the display device. The driving IC 340 receives touch sensing signals from the upper substrate 390 in order to determine whether there is a touch, as well as a position of the touch.

In one embodiment, the driving IC 340 processes the touch sensing signals as described above. In another embodiment, the FPCB (not shown) connected to the FPCB connection pad 330 or another circuit part (not shown) may process the touch sensing signals.

FIG. 3B is an X-axis sectional view of the in-cell type flat panel display device of FIG. 3A.

Referring to FIG. 3B, the in-cell type flat panel display device according to an embodiment of the present invention includes the lower substrate 360, the emission layer 370, an adhesive layer 380, the FPCB connection pad 330, the driving IC 340, and the upper substrate 390.

The lower substrate 360 is a substrate in which a plurality of TFTs are disposed, and controls a voltage or a current applied to the emission layer 370. The emission layer 370 is formed in the lower substrate 360, and emits light with a current supplied from the lower substrate 360, thereby defining the active area 310.

The adhesive layer 380 is formed on the emission layer 370, for coupling the upper substrate 390 to the lower substrate 360 with the emission layer 370 formed therein. Also, the adhesive layer 380 is coated over the emission layer 370, thereby preventing the penetration of moisture and oxygen into the emission layer 370.

The upper substrate 390 is disposed on the adhesive layer 380, and includes a plurality of touch sensors (not shown) disposed in the active area 310. Each of the touch sensors (not shown) is connected to one end of a corresponding sensing line (not shown) disposed in the inactive area 320, and the other end of the sensing line (not shown) is connected to the first or second upper contact pad 353 or 354.

When a touch is sensed, each touch sensor (not shown) transfers a touch sensing signal to the first or second upper contact pad 353 or 354 connected to a corresponding sensing line (not shown).

The upper substrate 390, as illustrated in FIG. 3B, includes an upper cutting area for externally exposing the FPCB connection pad 330 and the driving IC 340.

The upper cutting area will now be described in more detail with reference to FIG. 3C.

FIG. 3C is a Y-axis sectional view of the in-cell type flat panel display device of FIG. 3A.

Referring to FIG. 3C, the in-cell type flat panel display device according to an embodiment of the present invention includes the lower substrate 360, the contact pad 350, the adhesive layer 380, and the upper substrate 390.

The contact pad 350, as illustrated in FIG. 3C, includes first and second lower contact pads 351 and 352, first and second upper contact pads 353 and 354, and first and second sealing materials 355 and 356.

The first lower contact pad 351 is disposed in the lower substrate 360, and disposed at a first side of the inactive area 320. There may be a single first lower contact pad 351, or, as illustrated in FIG. 3C, there may a plurality of first lower contact pads 351. Each of the first lower contact pads 351 is electrically connected to the FPCB connection pad 330 through a corresponding signal line (not shown).

The second lower contact pad 352 is disposed in the inactive area 320 in the lower substrate 360, and disposed at a second side facing the first side at which the first lower contact pad 351 is disposed. There may be a single second lower contact pad 352 or, as illustrated in FIG. 3A, there may be a plurality of second lower contact pads 352. Each of the second lower contact pads 352 is electrically connected to the FPCB connection pad 330 through a corresponding signal line (not shown).

The first upper contact pad 353 is disposed under the upper substrate 390, and disposed to face the first lower contact pad 351. The second upper contact pad 353 is disposed under the upper substrate 390, and disposed to face the second lower contact pad 352.

The first sealing material 355 is disposed between the first lower contact pad 351 and the first upper contact pad 353. The first sealing material 355 includes a plurality of AU balls 357, and electrically connects the first lower contact pad 351 and the first upper contact pad 353 which contact the AU balls 357.

The second sealing material 356 is disposed between the second lower contact pad 352 and the second upper contact pad 354. The second sealing material 356 includes a plurality of AU balls 357, and electrically connects the second lower contact pad 352 and the second upper contact pad 354 which contact the AU balls 357.

Each of the first and second sealing materials 355 and 356 may contain the AU balls 357 by 1 wt % to 15 wt %.

The adhesive layer 380 is formed between the lower substrate 360 and the upper substrate 390, for coupling the lower substrate 360 to the upper substrate 390. The adhesive layer 380, as illustrated in FIG. 3C, surrounds the contact pad 350. In one embodiment, the adhesive layer 380 can either fully surround or partially surround the contact pad 350.

The in-cell type flat panel display device in which the adhesive layer 380 is formed as described above cuts off the first and second sealing materials 355 and 356 from the outside, thus ensuring a contact between the lower contact pad and the upper contact pad.

In the above-described embodiment, each of the first and second sealing materials 355 and 356 has been described above as including the AU balls 357. In other embodiments, each of the first and second sealing materials 355 and 356 can be other types of conductive balls other than AU balls 357.

The upper substrate 390 includes an upper cutting area formed between first and second areas of the display device in order for a portion of the lower substrate 360 to be exposed. The upper substrate 390 is cut away and does not overlap with the lower substrate 360 in the upper cutting area. This is because the upper substrate 290 needs to be opened for electrically connecting the FPCB connection pad 230 and the driving IC 240, which are formed in the lower substrate 360, to the outside.

Referring to FIG. 3A, the exposed portion of the first substrate 360 has a bottom boundary where it meets the second substrate 390. This boundary of the exposed portion is shown with five straight lines. The shape of the boundary and the location of the contact pads 150 causes the exposed portion of the first substrate 360 to extend past the contact pads 150. Distance L1 represents the maximum perpendicular distance between the top side of the first substrate 360 and the boundary of the exposed portion. Distance L2 represents the perpendicular distance between the top side of the first substrate 360 and the contact pads 150. As shown, distance L1 is greater than distance L2. In some embodiments, the perpendicular distance from the top side of the first substrate 360 to the left side contact pad 150 may be different than perpendicular distance to the right side contact pad 150.

Some parts of the boundary between the exposed portion of the first substrate 360 and the second substrate 390 may be closer to the top side of the first substrate 360 than other parts of the boundary. Additionally, some parts of the exposed portion of the lower substrate 360 are directly between the contact pads 350 and are aligned with the contact pads 350 along the Y axis, i.e. along a straight line that crosses through the first contact pads 350 and the second contact pads 350.

Referring back to FIG. 3C, the first area on the side of the substrate includes a first upper contact pad area with the first upper contact pad 353 disposed therein and a first adhesive area with the adhesive area 380 formed therein. The second area on the side of the substrate includes a second upper contact pad area with the second upper contact pad 354 disposed therein and a second adhesive area with the adhesive area 380 formed therein.

In an embodiment, as illustrated in FIG. 3C, the driving IC 340 is not disposed directly between the first and second areas of the display device. In another embodiment, however, since the upper cutting area is formed between the first and second areas of the display device as described above, the driving IC 340 may be disposed directly between the first and second areas of the display device such that it is aligned with the Y-axis.

Unlike the related art flat panel display device of FIG. 2A, the in-cell type flat panel display device in which the upper cutting area is formed as described above has a bezel area which is not enlarged although the contact pad 350 is provided.

FIGS. 4A to 4E are plan views illustrating a method of manufacturing an in-cell type flat panel display device according to an embodiment of the present invention.

Figure 4A:
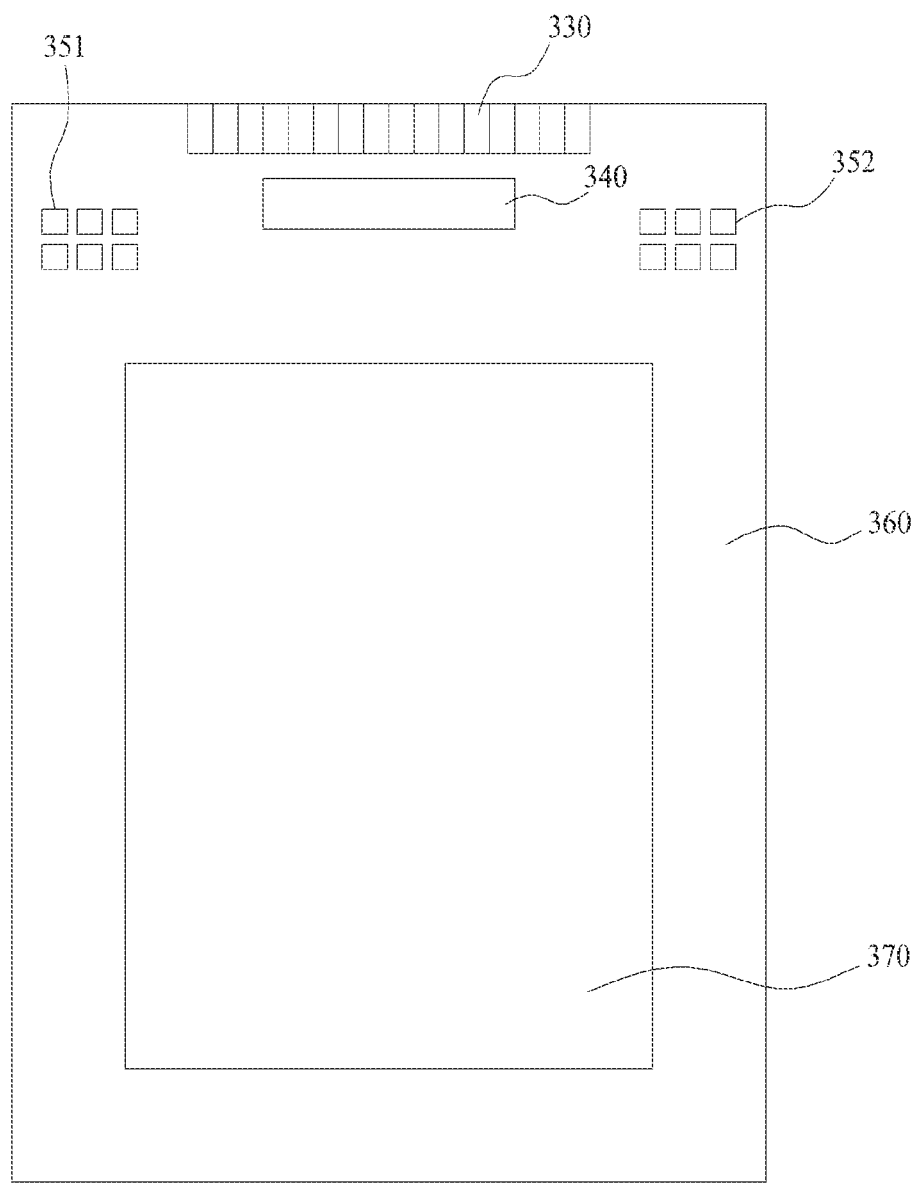
FIG. 4A-4E are plan views illustrating a method of manufacturing an in-cell type flat panel display device according to an embodiment of the present invention.

As seen in FIG. 4A, prepared is the lower substrate 360 in which the emission layer 370, the FPCB connection pad 330, the driving IC 340, and the first and second lower contact pads 351 and 352 are disposed. As previously discussed, the lower substrate 360 may also include a thin film transistor layer (not shown) that is formed in the lower substrate 360.

The first lower contact pad 351 is disposed at a left side of the lower substrate 360 outside the emission layer 370. The second lower contact pad 352 is disposed outside the emission layer 370, and specifically disposed at a right side of the lower substrate 360 that is opposite from the left side of the lower substrate 360 where the first lower contact pad 351 is disposed.

The FPCB connection pad 330 is disposed outside the emission layer 370, and specifically disposed at a top side of the lower substrate 360 which connects the left and right sides. The driving IC 340 is disposed outside the emission layer 370, and specifically disposed between the FPCB connection pad 330, the first lower contact pad 351, and the second lower contact pad 352.

Figure 4B:
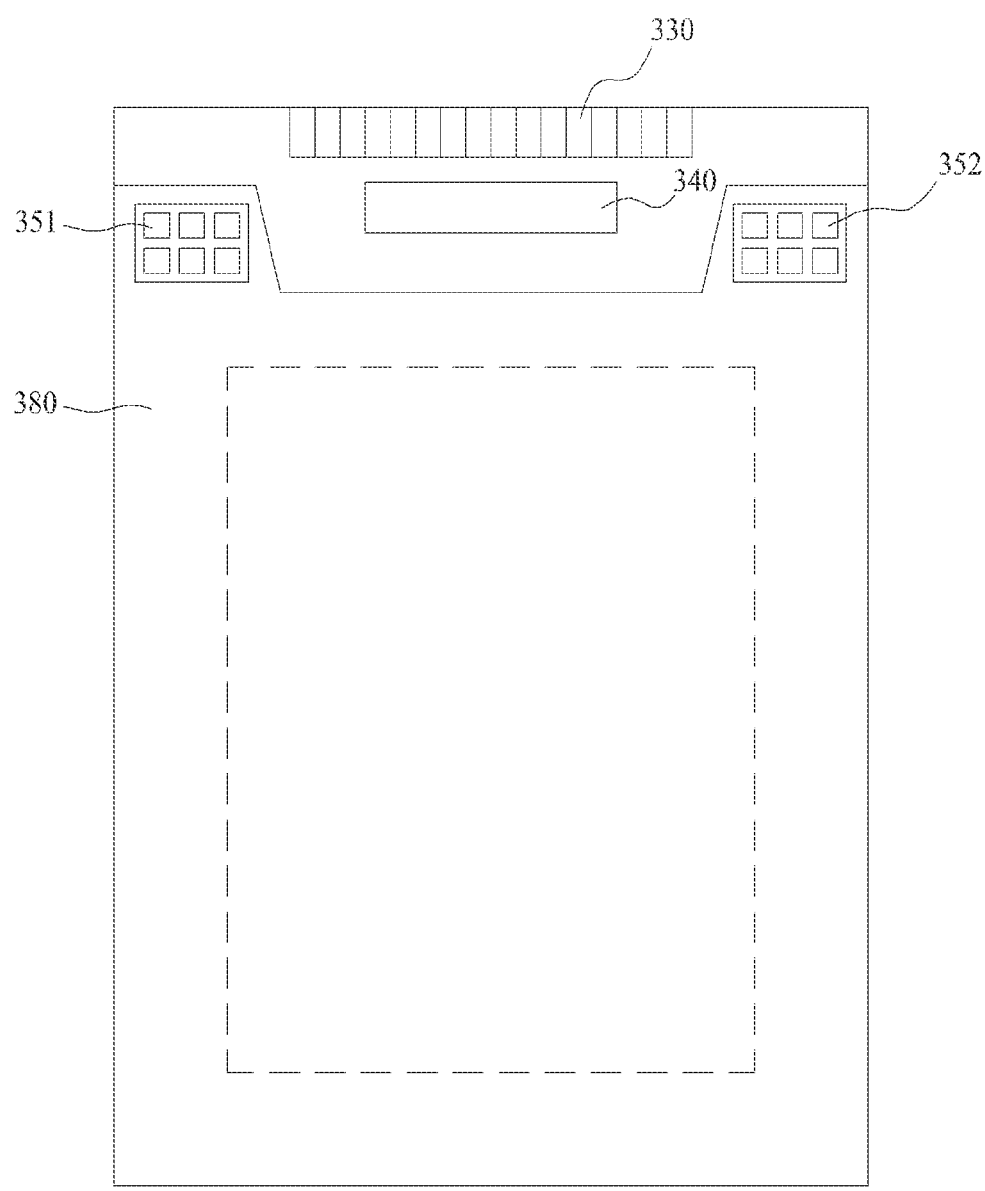

As seen in FIG. 4B, the adhesive layer 380 is formed in the lower substrate 360. The adhesive layer 380 is formed over the emission layer 370 for preventing the penetration of moisture and oxygen into the emission layer 370, and moreover, in order to couple the adhesive layer 380 to the upper substrate 390, the adhesive layer 380 is formed over most of the inactive area except for in an area in which the FPCB connection pad 330, the driving IC 340, and the first and second lower contact pads 351 and 352 are disposed, in the inactive area.

In this case, the adhesive layer 380 is formed to surround the first and second lower contact pads 351 and 352 disposed in the lower substrate 360. The adhesive layer 380 is not formed in a partial area between the first and second lower contact pads 351 and 352.

Figure 4C:
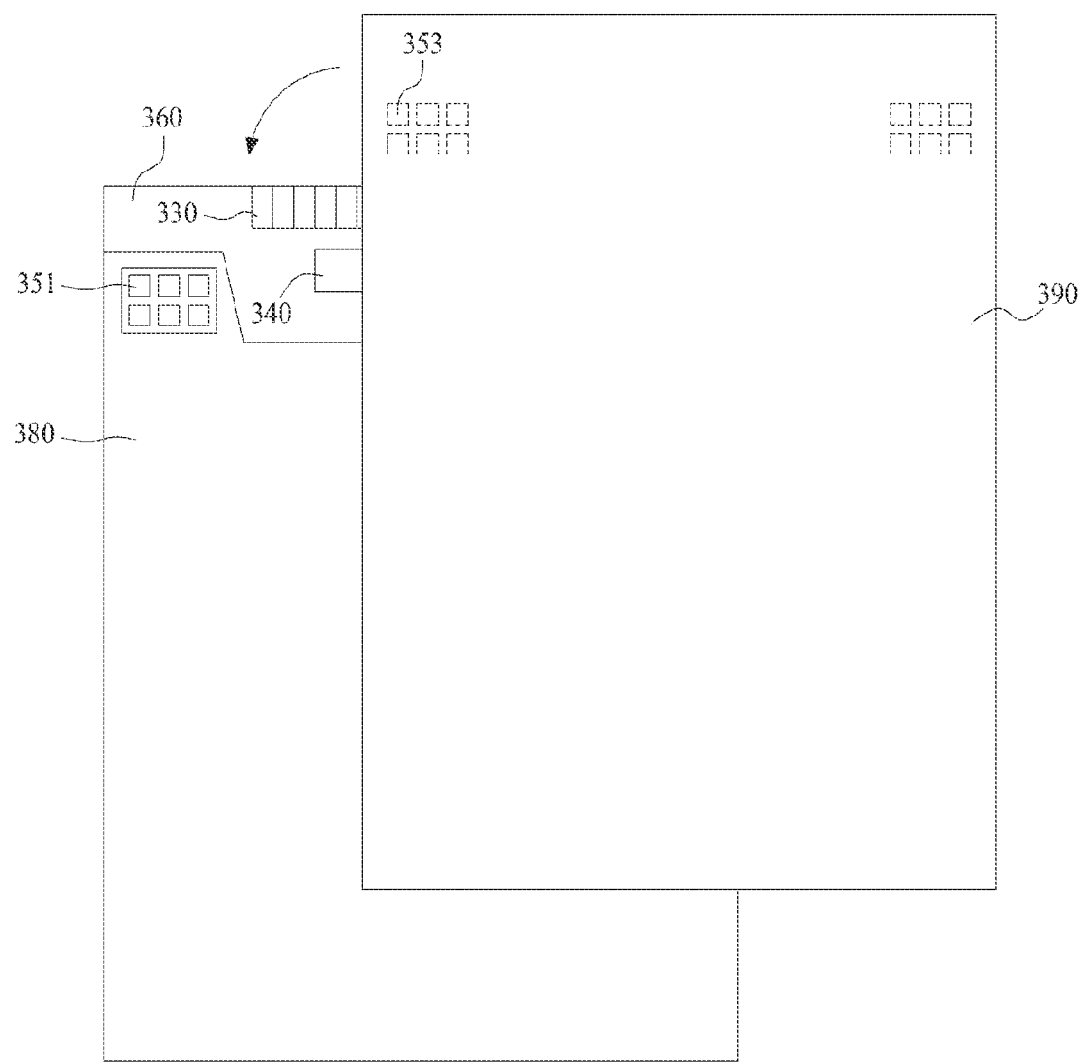

As seen in FIG. 4C, the upper substrate 390 with the first and second upper contact pads 353 and 354 disposed therein is deposited in the lower substrate 360.

The first upper contact pad 353 is disposed under the upper substrate 390 to face the first lower contact pad 351, and the second upper contact pad 354 is disposed under the upper substrate 390 to face the second lower contact pad 352.

Furthermore, although not shown in FIG. 4C, a sealing material including a plurality of AU balls is disposed under the first and second upper contact pads 353 and 354, in the upper substrate 390. In this case, the sealing material may contain the AU balls by 1 wt % to 15 wt %, for optimizing a depositing condition with the lower substrate 360.

Figure 4D:
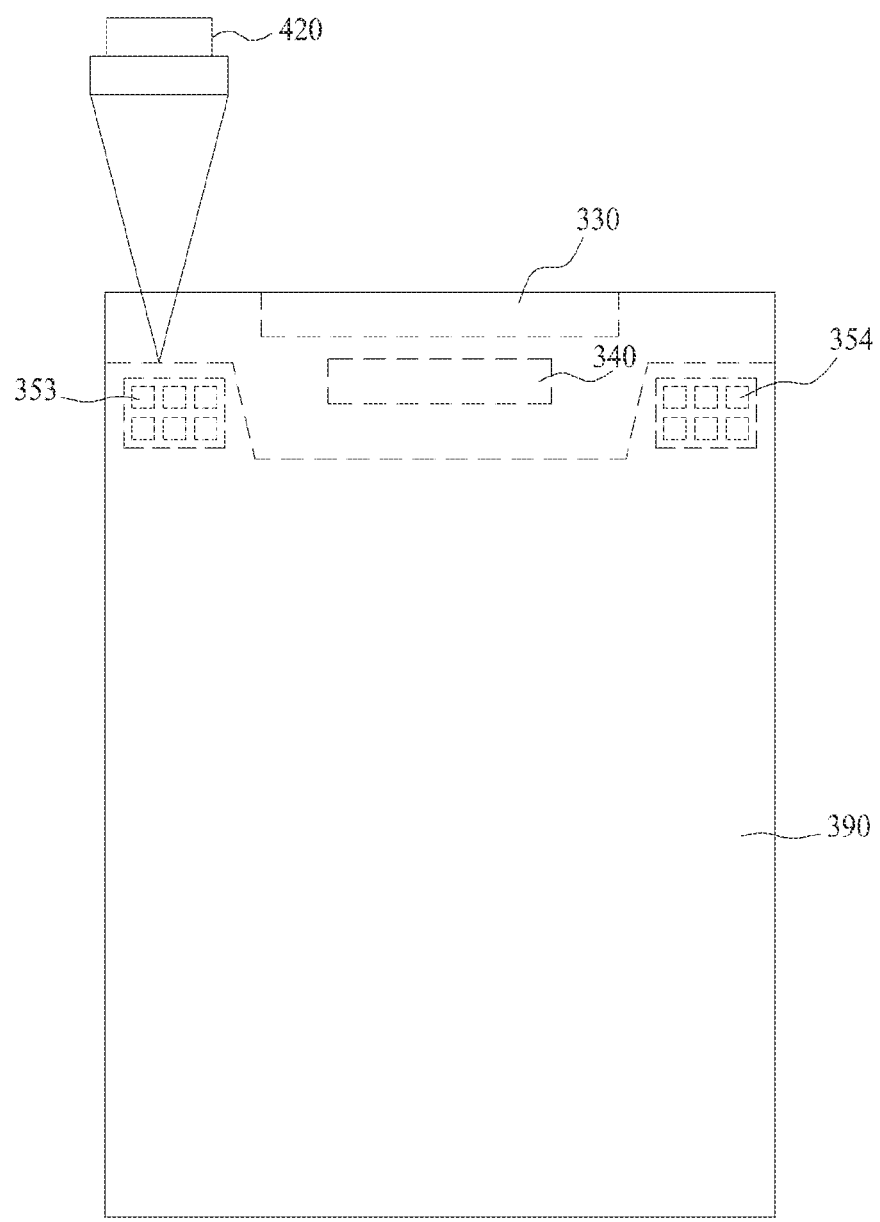

As seen in FIG. 4D, a laser beam is irradiated on the upper substrate 390. Here, a laser 420 irradiates a laser beam along a laser cutting line which is extended as a plurality of straight lines from the left side to the right side of the upper substrate 290. The laser cutting line forms the boundary between the exposed portion of the lower substrate 360 and the upper substrate 390.

The laser cutting line is disposed outside an area in which the adhesive layer 380 is formed, and includes one or more straight lines disposed between the first and second areas of the display device. Here, the first area of the display device includes a first upper contact pad area and a first adhesive area, and the second area of the display device includes a second upper contact pad area and a second adhesive area.

For example, as illustrated in FIG. 4D, the laser cutting line may be extended as five straight lines from the left side to the right side of the upper substrate 390. In this case, three of the five straight lines may be disposed between the first and second areas of the display device.

Figure 5A:
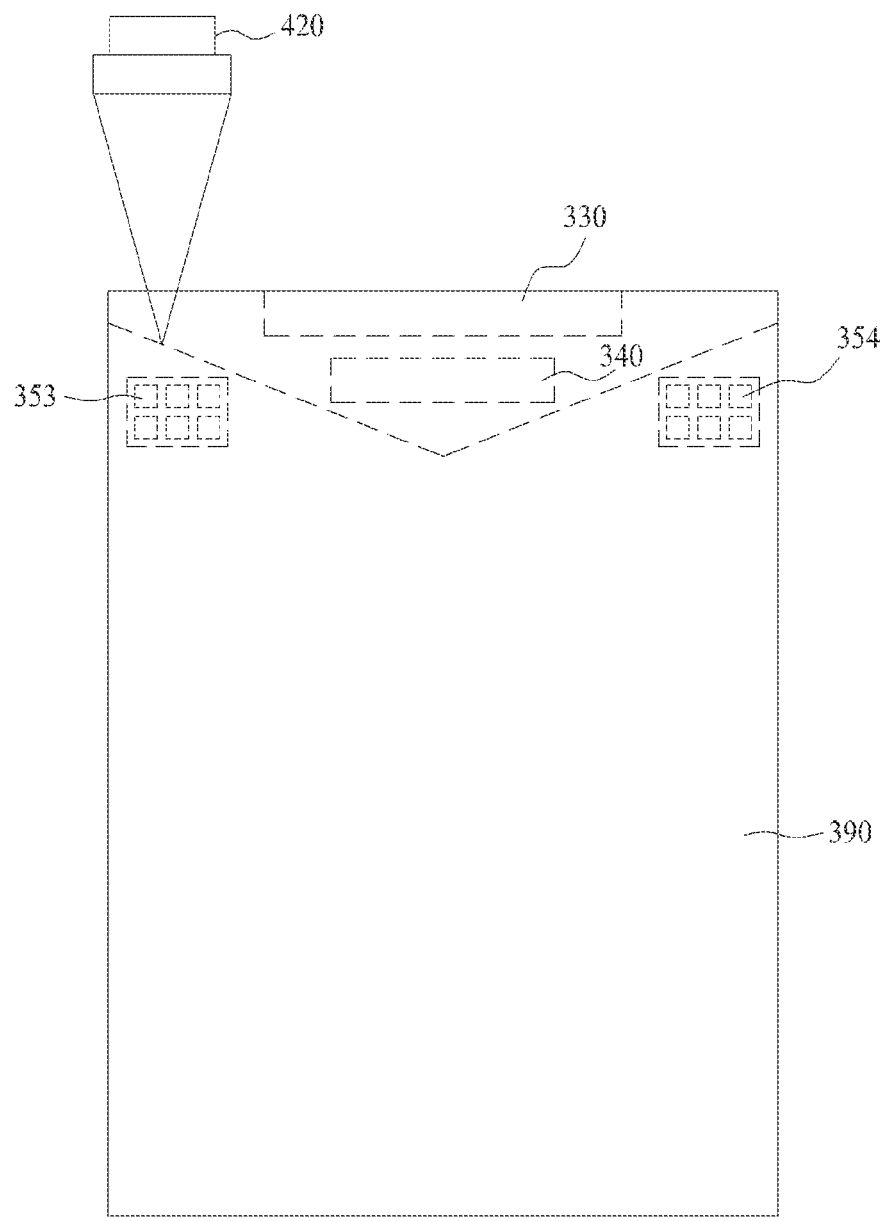
FIG. 5A-5B are plan views respectively illustrating laser cutting lines of an in-cell type flat panel display device according to another embodiment of the present invention.

As another example, as illustrated in FIG. 5A, the laser cutting line may be extended as two straight lines from the left side to the right side of the upper substrate 390. In this case, the two straight lines may be disposed between the first and second areas.

Figure 4E:
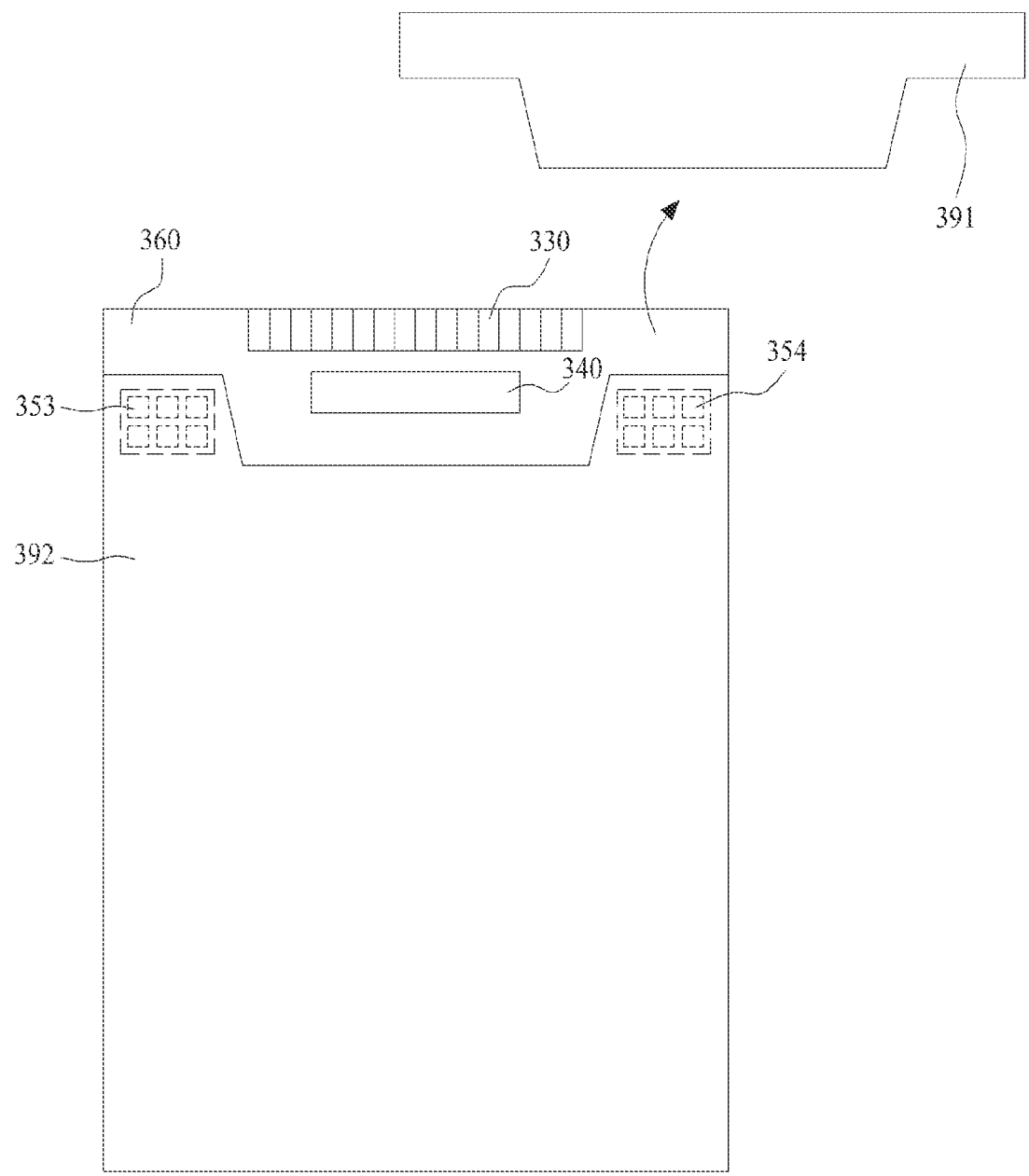
Figure 5B:
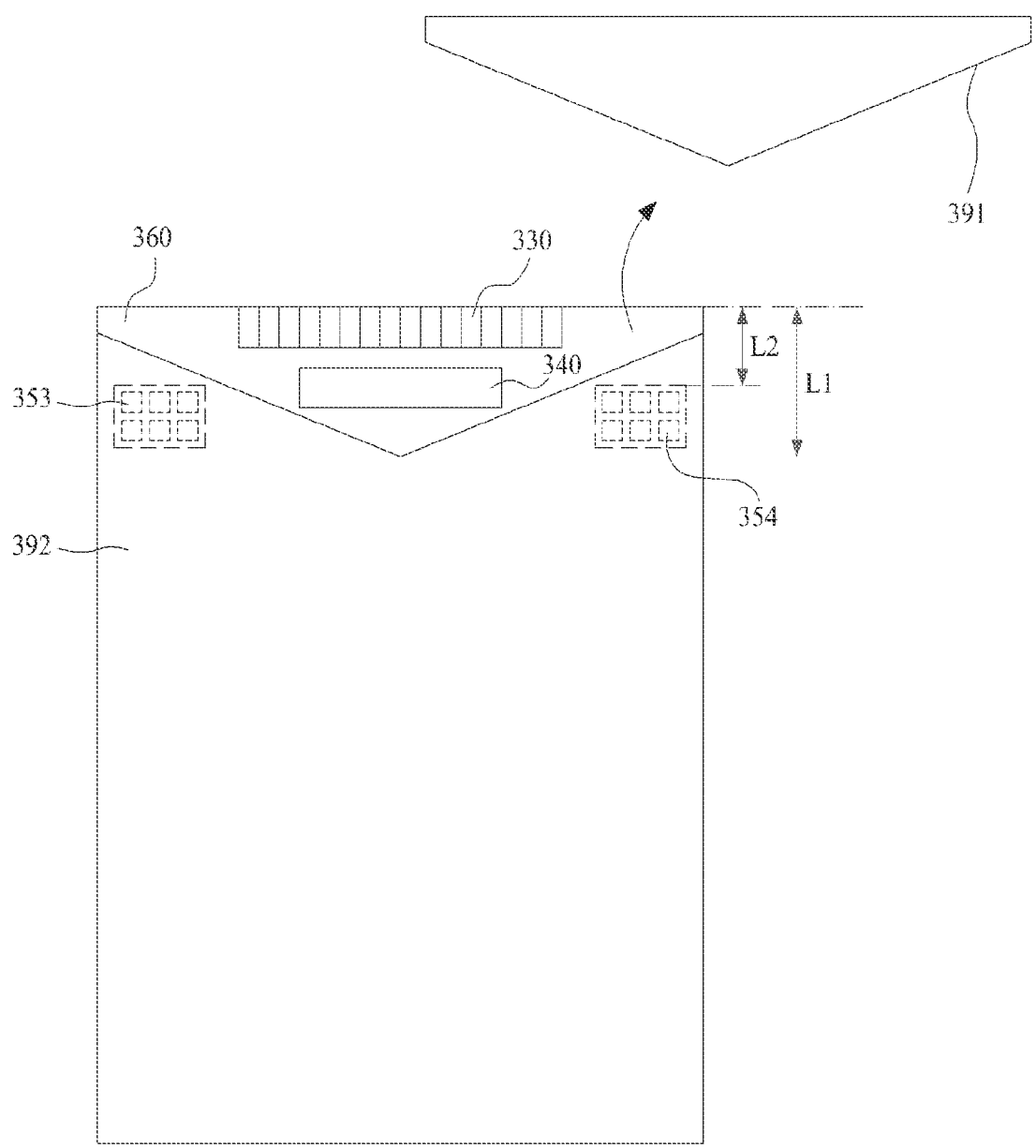

As seen in FIGS. 4E and 5B, the FPCB connection pad 330 and the driving IC 340 are opened and exposed by removing a portion 391 (cut by the laser 410) of the upper substrate 390.

In the embodiments shown in FIG. 4A-5E, the lower substrate 360 is first attached to the upper substrate 390 and then the laser 410 is used to remove a portion 391 of the upper substrate 390. In another embodiment, the portion 391 of the upper substrate 390 may first be removed by a laser 410. The removed portion 391 has a shape that corresponds to the portion of the lower substrate 360 that is to be exposed. After it is cut, the upper substrate 390 is then attached to the lower substrate 360.

Figure 6:
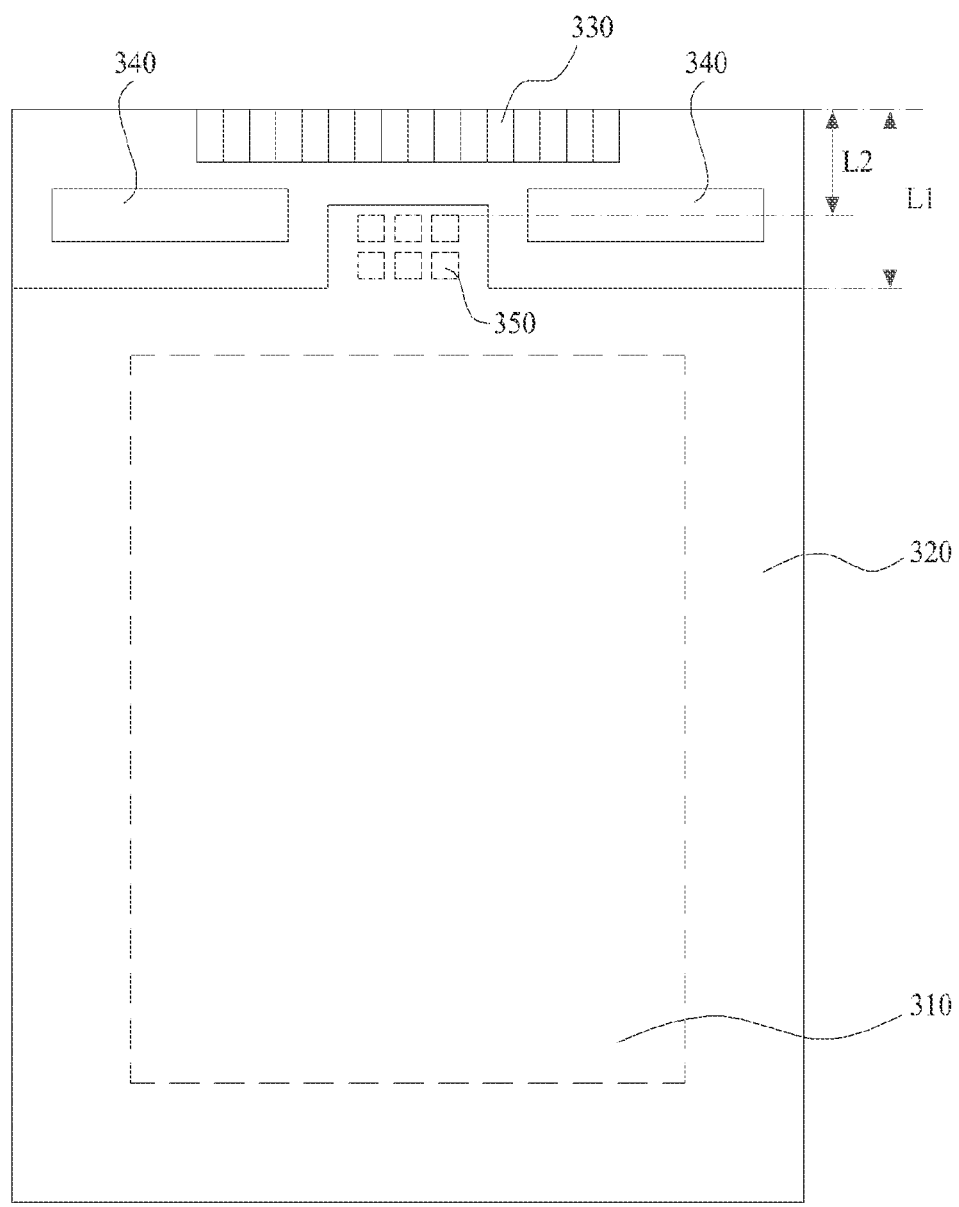
FIG. 6-8 are plan views schematically illustrating a flat panel display device according to additional embodiments of the present invention.
Figure 7:
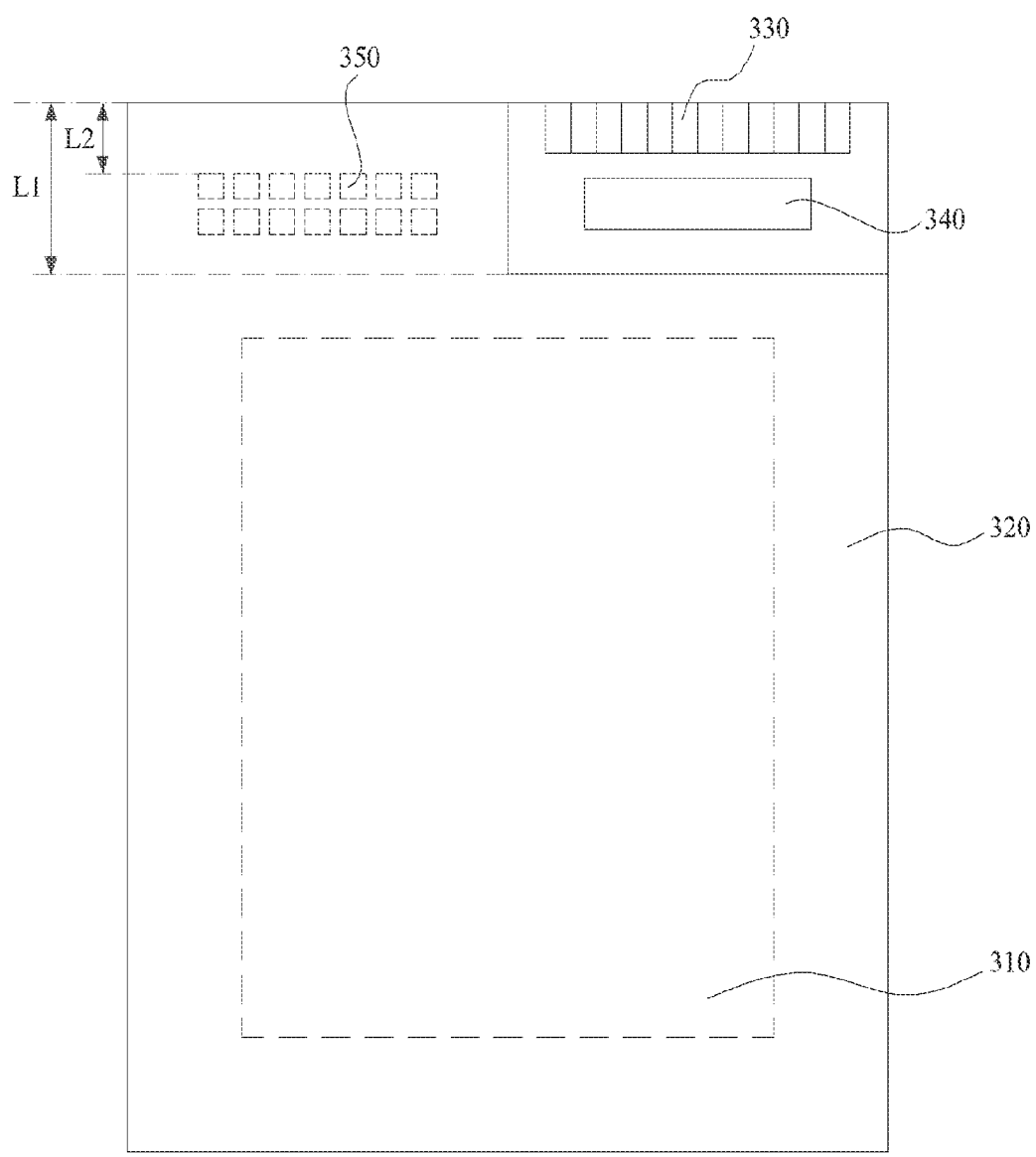
Figure 8:
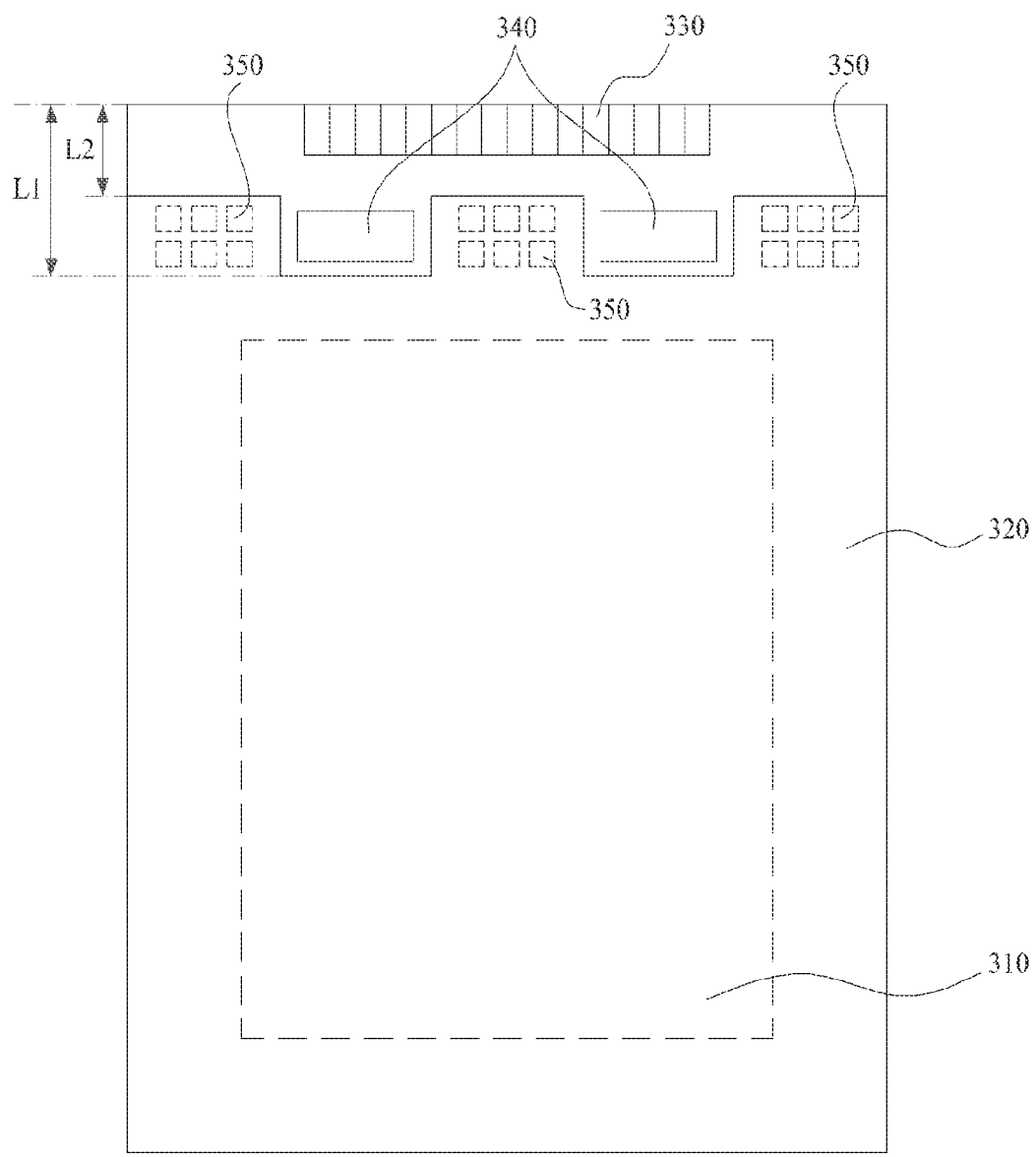

FIG. 6-8 are plan views schematically illustrating a flat panel display device according to additional embodiments of the present invention. The display device of FIG. 6 is similar to the display device of FIG. 3A, but now includes a single contact pad 350 instead of two contact pads 350. The contact pad 350 is located near the middle of the display device. The exposed portion of the lower substrate 360 is located on both the left and right sides of the contact pad 350. Additionally, there are now two ICs 340 attached to the lower substrate 360. One IC 340 is located to the left of the contact pad 350, and one IC 340 located to the right of the contact pad 350.

The display device of FIG. 7 is similar to the display device of FIG. 3A, but now includes a single contact pad 350 instead of two contact pads 350. The contact pad 350 is located on the left side of the display device. The exposed portion of the lower substrate 360 is located only on the right side of the contact pad 350. The IC 340 is also located on the right side of the contact pad.

The display device of FIG. 8 is similar to the display device of FIG. 3A, but now includes a three contact pads 350 instead of two contact pads 350. A left contact pad 350 is located at the left side of the display device, a right contact pad is located at a right side of the display device 350, and a middle contact pad 350 is located near the middle of the display device. There are also two ICs 340. One IC 340 is located between and is aligned with the left contact pad 350 and the middle contact pad 350. Another IC 340 is located between and is aligned with the right contact pad 350 and the middle contact pad 350.

According to the present invention, the driving IC is disposed between the areas in which the contact pads are respectively disposed, thus preventing the bezel area from being enlarged due to the formation of the contact pads.

According to the present invention, since the adhesive layer surrounds the contact pads, the contact pads are not affected by an external environment, thus ensuring a contact between the lower substrate and the upper substrate.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A flat panel display device, comprising:
 a first substrate;
 a connection pad located along a side of the first substrate;
 a second substrate that overlaps with the first substrate, wherein the second substrate does not overlap with an exposed portion of the first substrate; and
 a first contact pad electrically coupling the second substrate and the first substrate, the first contact pad overlapped by the first substrate and the second substrate,
 wherein a first distance from the side of the first substrate to a boundary between the exposed portion of the first substrate and the second substrate is greater than a second distance from the side of the first substrate to the first contact pad.

2. The display device of claim 1, further comprising:
 a second contact pad electrically coupling the second substrate and the first substrate,
 wherein the first distance from the side of the first substrate to the boundary between the exposed portion of the first substrate and the second substrate is greater than a third distance from the side of the first substrate to the second contact pad.

3. The display device of claim 2, wherein at least a part of the exposed portion of the first substrate is between the first contact pad and the second contact pad and aligned along a straight line with the first contact pad and the second contact pad.

4. The display device of claim 3, further comprising:
 an integrated circuit disposed on the exposed portion of the first substrate, wherein the integrated circuit is located between the first contact pad and the second contact pad and aligned along a straight line with the first contact pad and the second contact pad.

5. The display device of claim 2, wherein the first substrate and the second substrate include an active area and an inactive area outside of the active area, the first contact pad is located at a first side of the inactive area, and the second contact pad is located at a second side of the inactive area that is opposite to the first side.

6. The display device of claim 1, further comprising:
 an adhesive layer formed between the first substrate and the second substrate, the adhesive layer surrounding the first contact pad.

7. The display device of claim 1, wherein the second substrate includes a touch sensor and the first contact pad is adapted to transfer a touch sensing signal between the touch sensor and the first substrate.

8. The display device of claim 6, wherein the first contact pad is electrically coupled to the connection pad.

9. The display device of claim 1, further comprising:
 a light emission layer between the first substrate and the second substrate,
 wherein the first substrate includes thin film transistors that are electrically coupled to the light emission layer and are adapted to control light emitted by the light emission layer.

10. The display device of claim 1, further comprising:
 an integrated circuit located on the exposed portion of the first substrate.

11. The display device of claim 1, wherein the exposed portion of the first substrate is located at both a first side of the contact pad and a second side of the contact pad that is opposite from the first side of the contact pad.

12. The display device of claim 1, wherein the boundary between the exposed portion of the first substrate and the second substrate is comprised of a plurality of straight lines.

* * * * *